(12) United States Patent
Sung et al.

(10) Patent No.: US 10,658,332 B2
(45) Date of Patent: May 19, 2020

(54) STACK PACKAGES INCLUDING BRIDGE DIES

(71) Applicant: SK hynix Inc., Icheon-si Gyeonggi-do (KR)

(72) Inventors: Ki Jun Sung, Cheongju-si (KR); Jong Hoon Kim, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/219,676

(22) Filed: Dec. 13, 2018

(65) Prior Publication Data

US 2020/0075542 A1   Mar. 5, 2020

(30) Foreign Application Priority Data

Aug. 28, 2018 (KR) .................. 10-2018-0101256

(51) Int. Cl.
| | | |
|---|---|---|
| H01L 25/065 | (2006.01) | |
| H01L 23/31 | (2006.01) | |
| H01L 23/498 | (2006.01) | |
| H01L 21/48 | (2006.01) | |
| H01L 23/522 | (2006.01) | |
| H01L 23/00 | (2006.01) | |
| H01L 23/538 | (2006.01) | |
| H01L 23/373 | (2006.01) | |

(52) U.S. Cl.
CPC ........ *H01L 25/0652* (2013.01); *H01L 21/486* (2013.01); *H01L 23/3114* (2013.01); *H01L 23/3128* (2013.01); *H01L 23/3135* (2013.01); *H01L 23/49827* (2013.01); *H01L 23/5226* (2013.01); *H01L 23/5381* (2013.01); *H01L 24/09* (2013.01); *H01L 24/17* (2013.01); *H01L 24/73* (2013.01); *H01L 25/0655* (2013.01); *H01L 25/0657* (2013.01); *H01L 23/373* (2013.01); *H01L 2224/0237* (2013.01)

(58) Field of Classification Search
CPC ............ H01L 25/0652; H01L 25/0655; H01L 25/0657; H01L 23/5381; H01L 23/25226; H01L 2924/3841; H01L 21/486; H01L 2225/06541; H01L 2225/06548; H01L 23/49827; H01L 2224/0237; H01L 2224/02371; H01L 2224/02372; H01L 2224/02373; H01L 2224/02379; H01L 24/09; H01L 24/17; H01L 24/73; H01L 23/1114; H01L 23/3121; H01L 23/3128; H01L 23/3135

See application file for complete search history.

(56) References Cited

U.S. PATENT DOCUMENTS 8,304,877 B2    11/2012  Fujii
2010/0171208 A1*  7/2010  Fujii ................... H01L 25/0657
                                                    257/686

FOREIGN PATENT DOCUMENTS

KR        101236798 B1     2/2013
KR     1020160023481 A     3/2016

* cited by examiner

*Primary Examiner* — Thanhha S Pham
(74) *Attorney, Agent, or Firm* — William Park & Associates Ltd.

(57) ABSTRACT

A stack package includes a second sub-package stacked on a first sub-package. The stack package also includes a plurality of dummy balls located between the first and second sub-packages to support the second sub-package. Each of the first and second sub-packages includes a semiconductor die and a bridge, die which are spaced apart from each other.

20 Claims, 17 Drawing Sheets

STACK PACKAGES INCLUDING BRIDGE DIES

CROSS-REFERENCE TO RELATED APPLICATIONS

The present application claims priority under 35 U.S.C 119(a) to Korean Application No. 10-2018-0101256, filed on Aug. 28, 2018, which is incorporated herein by reference in its entirety.

BACKGROUND

1. Technical Field

The present disclosure relates to semiconductor package technologies and, more particularly, to semiconductor packages including a bridge die spaced apart from a semiconductor die.

2. Related Art

Recently, semiconductor packages having a high density and operating at a high speed have been required in various electronic systems. In addition, the semiconductor packages have been developed to have a relatively small form factor. In order to realize such semiconductor packages, a lot of effort has been focused on chip stack technology. Moreover, in order to realize semiconductor packages having a reduced thickness, a lot of effort has been focused on a wafer level chip stack package technology.

SUMMARY

According to an embodiment, a stack package includes a first sub-package, a second sub-package, an inner connector, and a plurality of dummy balls. The first sub-package is configured to include a first semiconductor die, a first bridge die spaced apart from the first semiconductor die, a first inner molding layer covering the first semiconductor die and the first bridge die, and a first redistribution structure electrically connecting the first semiconductor die to the first bridge die. The second sub-package is stacked on the first sub-package. The inner connector electrically connects the first bridge die to the second sub-package. The plurality of dummy balls are disposed between the first and second sub-packages to support the second sub-package. The first bridge die includes a first body, a first through via penetrating the first body, and a first post bump connected to a first end of the first through via and protruding from a top surface of the first body. The first inner molding layer surrounds a side surface of the first post bump and reveals a top surface of the first post bump. The first redistribution structure electrically connects the first semiconductor die to a second end of the first through via.

According to another embodiment, a stack package includes a first sub-package, a second sub-package stacked on the first sub-package, an inner connector disposed between the first and second sub-packages to electrically connect the second sub-package to the first sub-package, a plurality of dummy balls disposed between the first and second sub-packages to support the second sub-package, and an outer connector electrically connected to the first sub-package. The first sub-package includes a first semiconductor die, a first bridge die, a first inner molding layer, a first redistributed line, and an outer redistributed line. The first bridge die is configured to include a first body spaced apart from the first semiconductor die, a first through via penetrating the first body, and a first post bump connected to a first end of the first through via and protruding from a top surface of the first body. The first inner molding layer is configured to cover the first semiconductor die, wherein the first inner molding layer has an extension part that extends laterally beyond side surfaces of the second sub-package. The first redistributed line electrically connects a second end of the first though via to the first semiconductor die. The outer redistributed line electrically connects the first redistributed line to the outer connector.

DETAILED DESCRIPTION OF THE EMBODIMENTS

Figure 1:
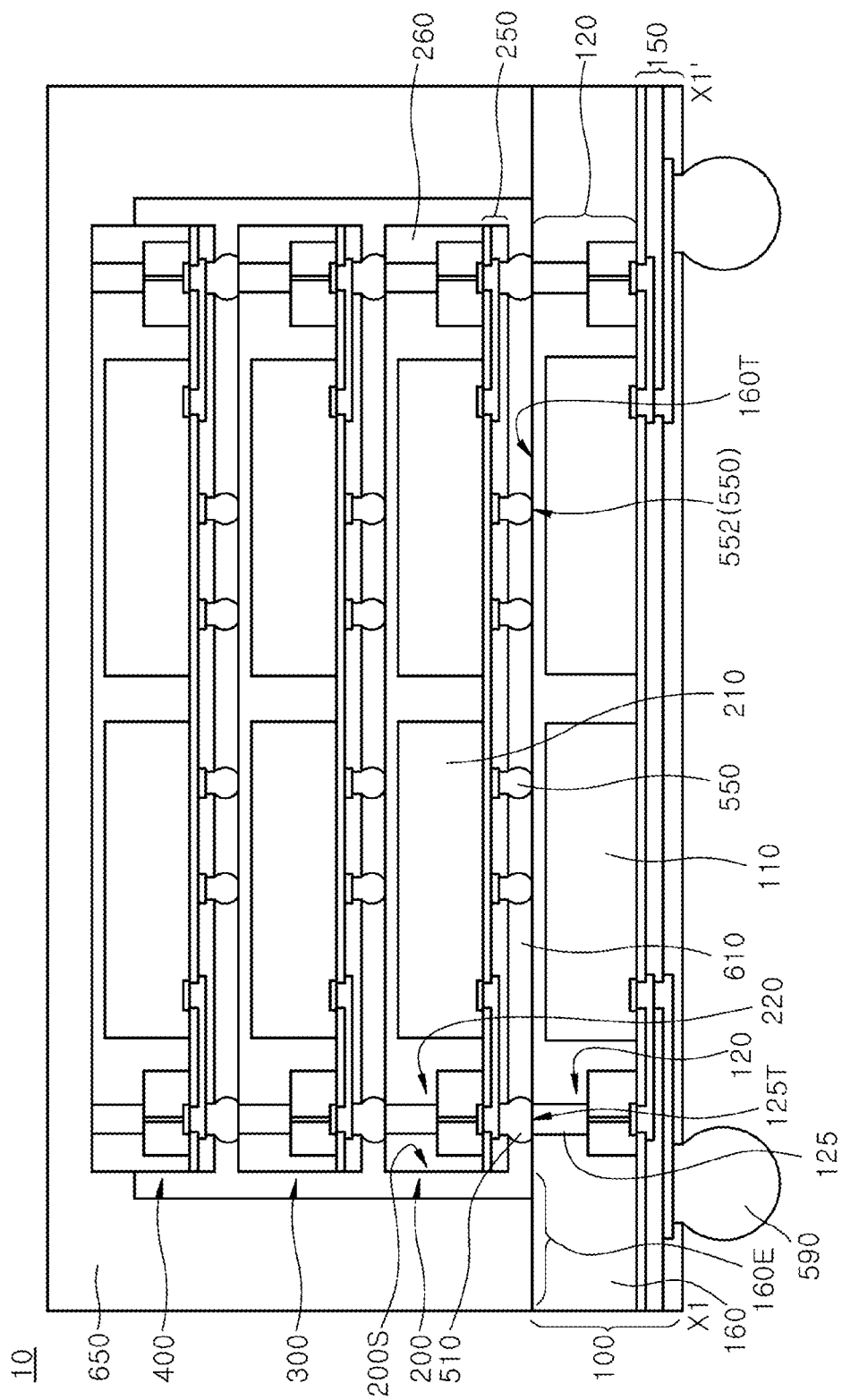
FIG. 1 shows a cross-sectional view illustrating a stack package, according to an embodiment.

The terms used herein may correspond to words selected in consideration of their functions in various embodiments, and the meanings of the terms may be construed to be different according to one of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, and are not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like, may be used to describe an element and/or a feature's relationship to another element(s) and/or feature(s) as, for example, illustrated in the figures. It will be understood that spatially relative terms are intended to encompass different orientations of a device in use and/or operation in addition to the orientation depicted in the figures. For example, when a device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate, such as a wafer, into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (Re-RAM) circuits, ferroelectric random access memory (Fe-RAM) circuits, or phase change random access memory (PcRAM) circuits, which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not indicated or described with reference to a drawing, the reference numeral may be indicated or described with reference to another drawing. In addition, even though a reference numeral is not shown in a particular drawing, it may be indicated or described with reference to another drawing.

FIG. 1 shows a cross-sectional view illustrating a stack package 10, according to an embodiment.

Referring to FIG. 1, the stack package 10 may be configured to include a first sub-package 100 and a second sub-package 200 vertically stacked on the first sub-package 100. Inner connectors 510 may be disposed between the first and second sub-packages 100 and 200 to electrically connect the first sub-packages 100 to the second sub-packages 200. The inner connectors 510 may be connection members such as micro solder balls or conductive bumps.

A plurality of dummy balls 550 may also be disposed between the first and second sub-packages 100 and 200. The plurality of dummy balls 550 may be disposed to be spaced apart from and electrically isolated from the inner connectors 510. The dummy balls 550 may be introduced to support the second sub-package 200.

Outer connectors 590 may be attached to the first sub-packages 100 to electrically connect with the first sub-packages 100. The outer connectors 590 may be connection members for electrically connecting the stack package 10 to an external system or another electronic module. The outer connectors 590 may be solder balls.

The stack package 10 may further include additional sub-packages vertically stacked on the second sub-stack package 200. For example, a third sub-package 300 may be vertically stacked on a surface of the second sub-stack package 200 opposite to the first sub-package 100, and a fourth sub-package 400 may be vertically stacked on a surface of the third sub-stack package 300 opposite to the second sub-package 200. Although not shown in the drawings, more sub-packages may be additionally stacked on a surface of the fourth sub-package 400 opposite to the third sub-package 300. The inner connectors 510 and the dummy balls 550 may also be disposed between the second and third sub-packages 200 and 300 as well as between the third and fourth sub-packages 300 and 400. For some embodiments, each of the third and fourth sub-packages 300 and 400 may have the same shape and function as the second sub-package 200.

The stack package 10 may also include a filling layer 610 that fills a gap between the first and second sub-packages 100 and 200. The filling layer 610 may include a dielectric layer for electrically isolating the second sub-package 200 from the first sub-package 100. The filling layer 610 may include an underfill material. The filling layer 610 may be disposed to fill spaces between the second to fourth sub-packages 200, 300, and 400. Moreover, the filling layer 610 may extend to cover side surfaces of the second to fourth sub-packages 200, 300, and 400.

The stack package 10 may include an outer molding layer 650 that covers and protects the second to fourth sub-packages 200, 300, and 400. As used herein, the word "cover" can mean to directly cover or to indirectly cover. As shown in FIG. 1, for example, the outer molding layer 650 directly covers the fourth sub-package and indirectly covers the third sub-package. The outer molding layer 650 may be an encapsulating layer that covers a portion of the first sub-package 100, the filling layer 610, and the second to fourth sub-packages 200, 300, and 400. The outer molding layer 650 may be formed on a surface of the first sub-package 100 using an encapsulant material such as an epoxy molding compound (EMC) material to cover the second to fourth sub-packages 200, 300, and 400.

Although FIG. 1 illustrates an example in which the outer molding layer 650 is distinct from the filling layer 610, the outer molding layer 650 and the filling layer 610 may be simultaneously formed using a molded underfill layer in some embodiments.

Figure 2:
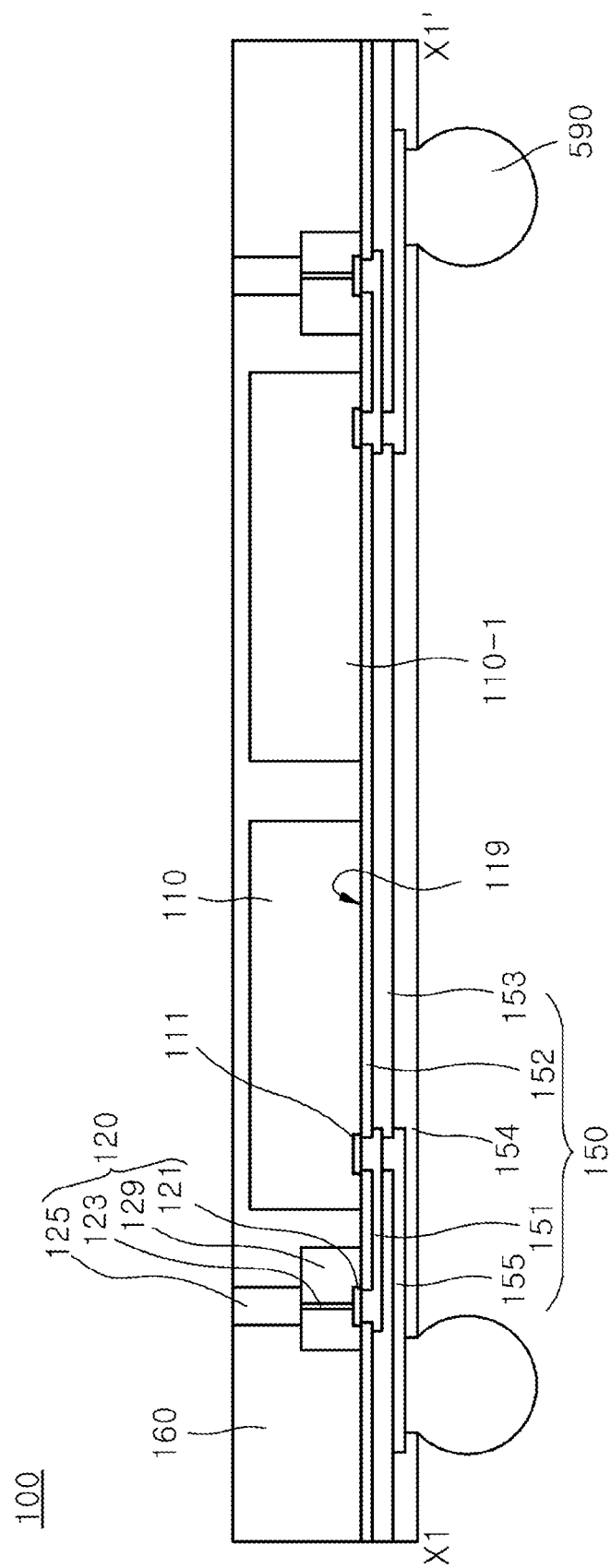
FIGS. 2 to 6 illustrate a first sub-package included in the stack package of FIG. 1.
Figure 3:
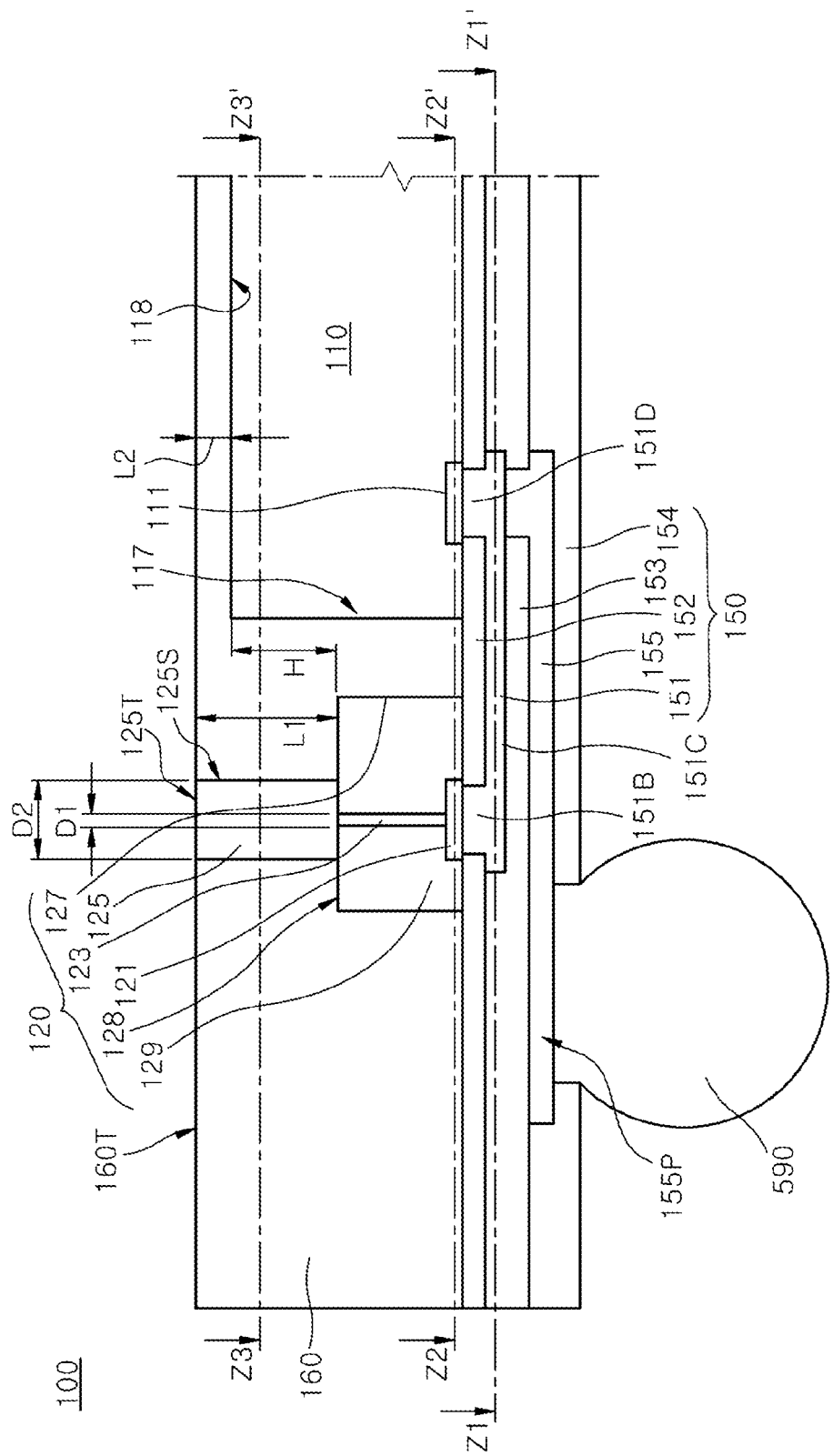
Figure 4:
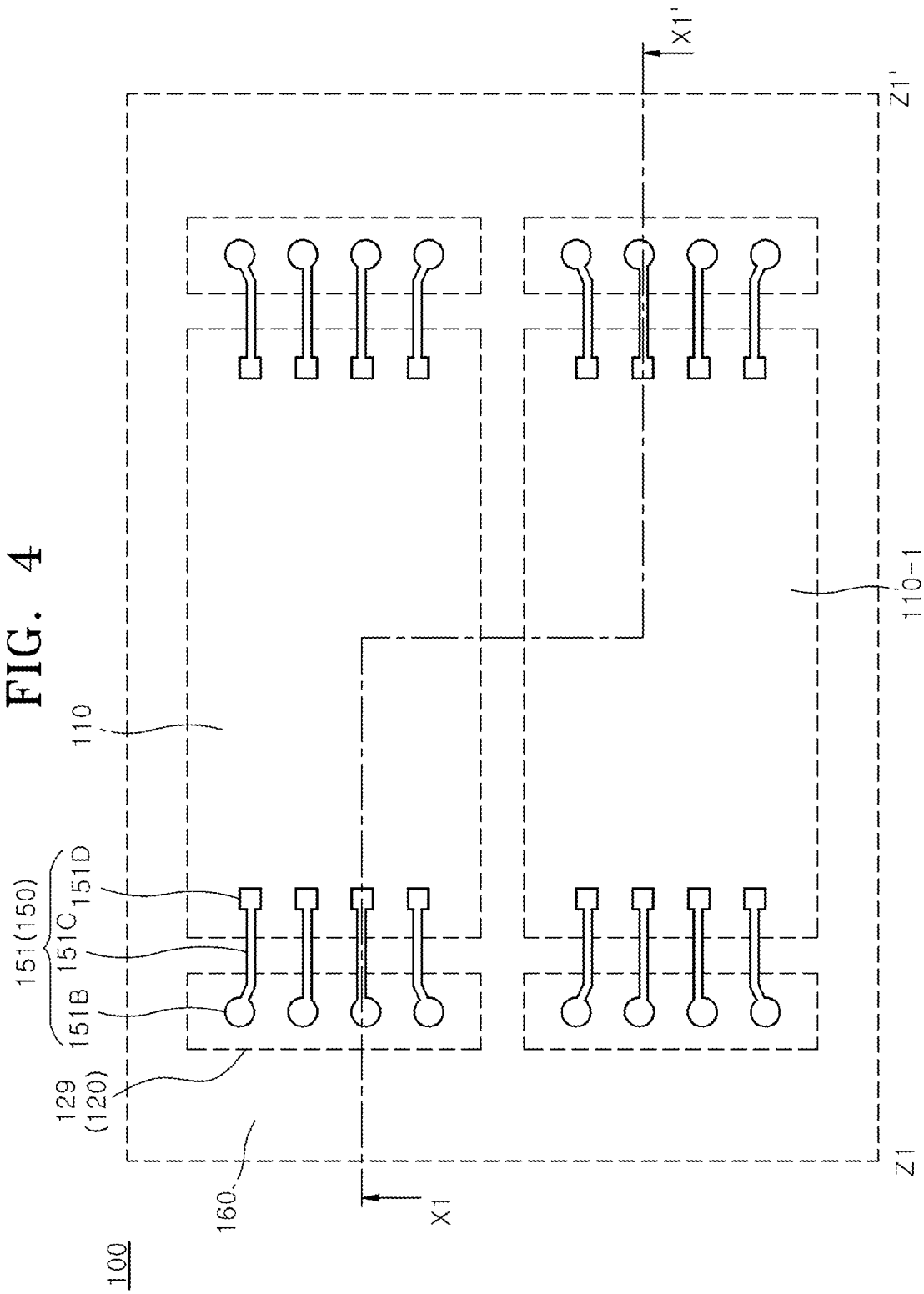
Figure 5:
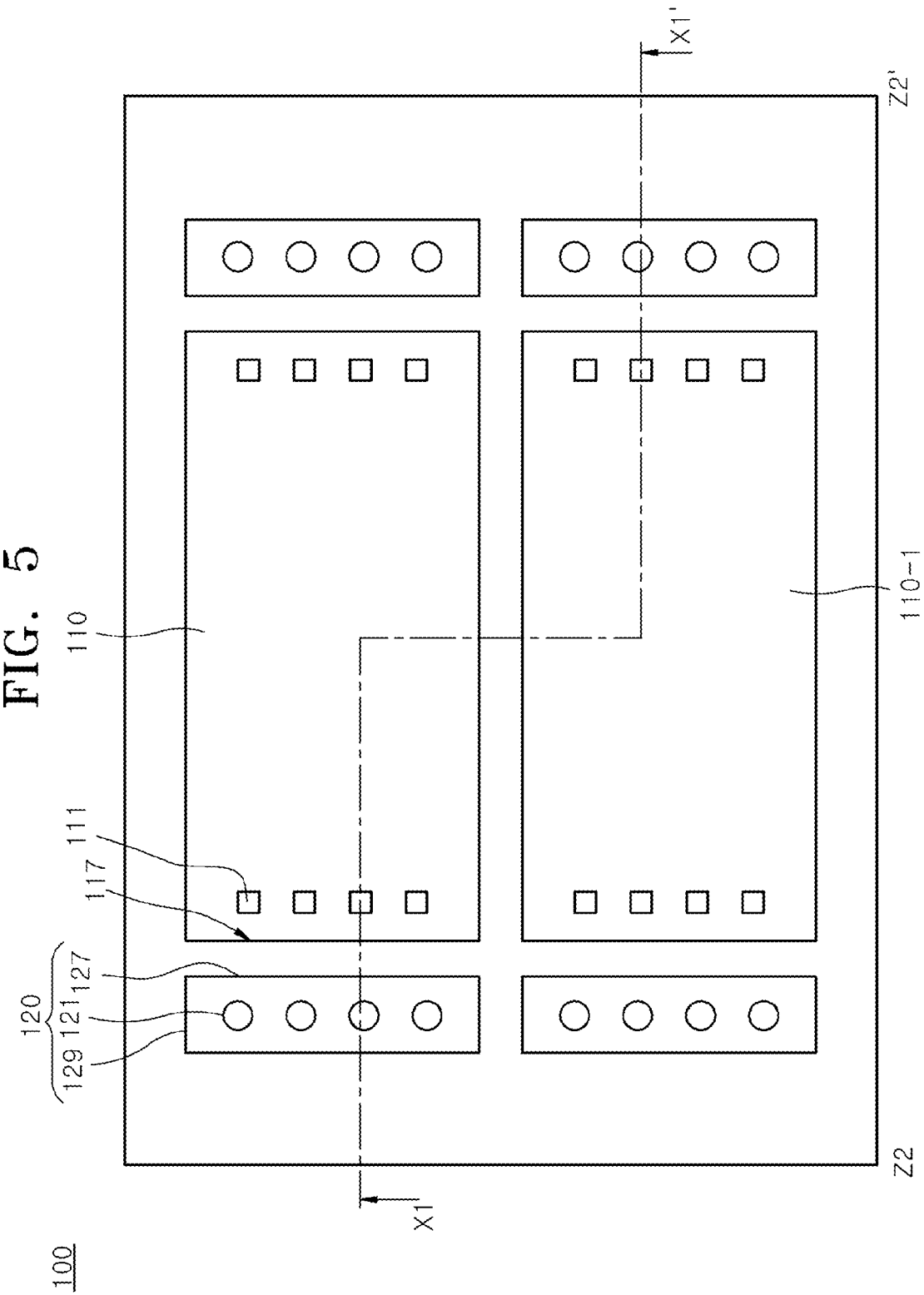
Figure 6:
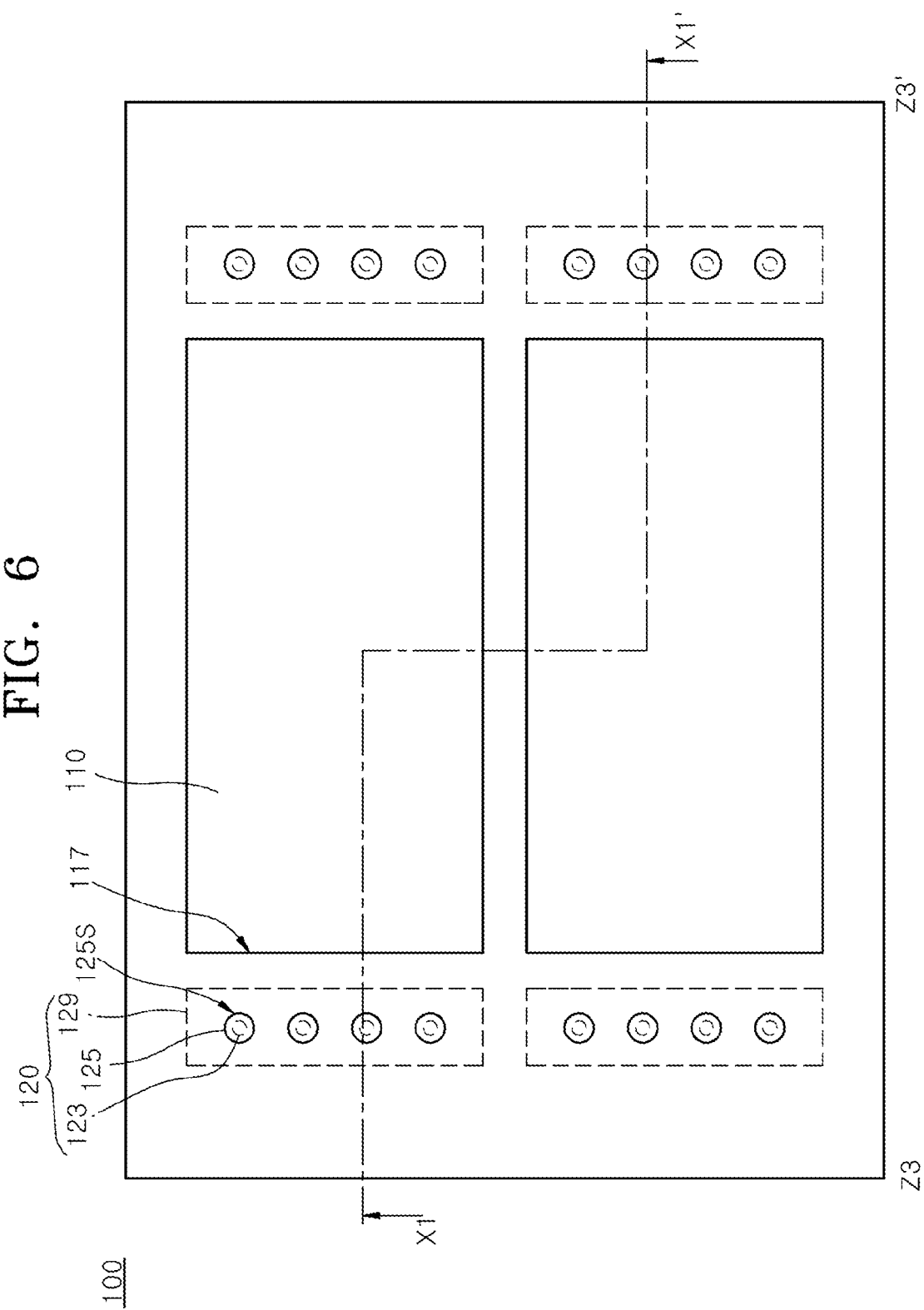

FIG. 2 shows a cross-sectional view illustrating the first sub-package 100 included in the stack package 10 of FIG. 1. FIG. 3 shows an enlarged view illustrating a portion (including a first bridge die 120) of the first sub-package 100 shown in FIG. 2. FIG. 4 shows a plan view taken along a horizontal line Z1-Z1' of FIG. 3 to illustrate first redistributed lines 151. FIG. 5 shows a plan view taken along a horizontal line Z2-Z2' of FIG. 3 to illustrate the first bridge die 120 and a first semiconductor die 110. FIG. 6 shows a plan view taken along a horizontal line Z3-Z3' of FIG. 3 to illustrate first post bumps 125 and the first semiconductor die 110. FIG. 2 corresponds to a cross-sectional view taken along a line X1-X1' of FIG. 4.

Referring to FIGS. 1 and 2, the first sub-package 100 may be provided as a single package unit disposed at a relatively low portion of the stack package 10. The first sub-package 100 may be configured to include the first semiconductor die 110 and a first inner molding layer 160 covering and protecting the first semiconductor die 110. The first semiconductor die 110 may be disposed on a first redistribution structure 150. The first bridge die 120 may be disposed on the first redistribution structure 150 to be spaced apart from the first semiconductor die 110. The first inner molding layer 160 may be formed to fill a gap between the first semiconductor die 110 and the first bridge die 120, which are disposed on the first redistribution structure 150.

Referring to FIGS. 2 and 3, the first semiconductor die 110 may be disposed on the first redistribution structure 150 in a face-down shape such that a first surface 119 of the first semiconductor die 110 faces the first redistribution structure 150. As illustrated in FIG. 3, the first semiconductor die 110 may also include a second surface 118 which is located at opposite side of the first redistribution structure 150 and may further include side surfaces 117 extending from edges of the first surface 119 to edges of the second surface 118. The first surface 119 of the first semiconductor die 110 may be an active surface at which integrated circuits of the first semiconductor die 110 are formed. The second surface 118 of the first semiconductor die 110 may be a bottom surface or a back side surface of the first semiconductor die 110. The terms "first," "second," etc. in the first surface 119 and the second surface 118 are only used to distinguish one element from another element, are not used to define the element itself or to imply a particular sequence.

First contact pads 111 may be disposed on the first surface 119 of the first semiconductor die 110. The first contact pads 111 may act as conductive paths for electrically connecting the first semiconductor die 110 to an external device. The first contact pads 111 may correspond to edge pads which are disposed on both edge regions of the first semiconductor die 110, as illustrated in a plan view of FIG. 5.

Referring to FIGS. 2 and 5, a third semiconductor die 110-1 may be disposed side by side with the first semiconductor die 110 on the first redistribution structure 150. The third semiconductor die 110-1 may be a semiconductor die having substantially the same shape and configuration as the first semiconductor die 110. The third semiconductor die 110-1 may be disposed to have a mirror image with respect to the first semiconductor die 110. The first and third semiconductor dies 110 and 110-1 may be memory semiconductor dies, such as DRAM dies.

As illustrated in FIGS. 3 and 5, the first bridge die 120 may be disposed to be spaced apart from one of the side surfaces 117 of the first semiconductor die 110. The first bridge die 120 may be disposed on the first redistribution structure 150 such that one of side surfaces 127 of a body 129 of the first bridge die 120 faces one of the side surfaces 117 of the first semiconductor die 110.

Referring to FIG. 3, the first bridge die 120 may be configured to include the body 129 and first post bumps 125 protruding from a top surface 128 of the body 129. There may be a level difference H between the top surface 128 of the body 129 of the first bridge die 120 and the second surface 118 of the first semiconductor die 110. The first bridge die 120 may be disposed to be adjacent to the first semiconductor die 110 such that the top surface 128 of the body 129 of the first bridge die 120 and the second surface 118 of the first semiconductor die 110 provide a step structure. The body 129 of the first bridge die 120 may be a semiconductor die having a thickness which is less than a thickness of the first semiconductor die 110. For some embodiments, the body 129 of the first bridge die 120 may have a thickness corresponding to 40% to 90% of a thickness of the first semiconductor die 110. For example, the body 129 of the first bridge die 120 may have a thickness corresponding to approximately 50% of a thickness of the first semiconductor die 110.

The first bridge die 120 may include first through vias 123 vertically penetrating the body 129 of the first bridge die 120. The body 129 of the first bridge die 120 may include a semiconductor material such as a silicon material. Because the body 129 of the first bridge die 120 is made from a semiconductor material, the first through vias 123 may be formed using a semiconductor manufacturing process, for example, a silicon wafer-based manufacturing process. Thus, the first through vias 123 may be formed to have a through silicon via (TSV) structure with a fine diameter D1. The first through vias 123 may be formed of a conductive metal material, for example, a copper material.

Since the body 129 of the first bridge die 120 is thinner than the first semiconductor die 110, the first through vias 123 vertically penetrating the body 129 of the first bridge die 120 may have a length which is less than a thickness of the first semiconductor die 110. For example, if the body 129 of the first bridge die 120 is as thick as the first semiconductor die 110, the first through vias 123 vertically penetrating the body 129 of the first bridge die 120 may be formed to have a length corresponding to a thickness of the first semiconductor die 110. However, because the body 129 of the first bridge die 120 is thinner than the first semiconductor die 110 in the present embodiment, the first through vias 123 vertically penetrating the body 129 of the first bridge die 120 may have a relatively short length as compared with a thickness of the first semiconductor die 110.

In order that the first through vias 123 have a relatively increased length with a relatively reduced diameter, an aspect ratio of via holes in which the first through vias 123 are formed may be increased. However, there may be some limitations in increasing the aspect ratio of the via holes due to a difficulty of a process for forming the via holes. In other word, if a thickness of the body 129 of the first bridge die 120 increases, a length of the via holes penetrating the body 129 of the first bridge die 120 may increase and a diameter of the via holes may also increase. That is, it may be difficult to form the via holes having a relatively increased length with a relatively reduced diameter. According to the present embodiment, because the body 129 of the first bridge die 120 has a relatively reduced thickness as compared with the first semiconductor die 110, the via holes to be filled with the first through vias 123 may have a relatively reduced length. Thus, the first through vias 123 may be formed to have the fine diameter D1. As a result, it may be possible to increase the number of the first through vias 123 formed in a limited area.

Referring to FIGS. 3 and 6, the first post bumps 125 may be electrically connected to upper portions of the first through vias 123, respectively. The first post bumps 125 may be disposed to overlap with the first through vias 123 in a plan view. As used herein, the word "overlap" can mean partially overlapping for some embodiments and completely overlapping for other embodiments. The first post bumps 125, for example, completely overlap the first through vias 123 when the first through vias 123 are completely covered, either directly or indirectly, by the first post bumps 125. The first post bumps 125 may protrude from the top surface 128 of the body 129 to have a certain height such that lower portions of side surfaces 125S of the first post bumps 125 face an upper portion of the side surface 117 of the first semiconductor die 110. The first inner molding layer 160 of the first sub-package 100 may be formed to cover the top surface 128 of the body 129 and to surround the side surfaces of the first post bumps 125. The first inner molding layer 160 may be formed to directly cover the side surfaces of the first post bumps 125 and to expose top surfaces 125T of the first post bumps 125. A distance L1 between a top surface 160T of the first inner molding layer 160 and the top surface 128 of the body 129 may be greater than a distance L2 between the top surface 160T of the first inner molding layer 160 and the second surface 118 of the first semiconductor die 110.

The inner connectors 510 may be bonded to the top surfaces 125T of the first post bumps 125, as illustrated in FIG. 1. The inner connectors 510 may electrically connect the first post bumps 125 to the second sub-package 200. As illustrated in FIG. 3, the first post bumps 125 may substantially penetrate a portion of the first inner molding layer 160, which is located on the body 129 of the first bridge die 120. Accordingly, the first post bumps 125 may extend electrical paths of the first through vias 123 to the top surface 160T of the first inner molding layer 160.

The first inner molding layer 160 may include an insulation material. A space between the first through vias 123 may be filled with a semiconductor material, for example, a silicon material. A space between the first post bumps 125 may be filled with a dielectric material of the first inner molding layer 160, for example, an epoxy molding compound (EMC) material. Since the first through vias 123 penetrate the body 129 made from a semiconductor material, an impedance value of each of the first through vias 123 may increase as compared with a case that the first through vias 123 penetrate a substrate including a dielectric material such as an EMC material. In addition, if the number of the first through vias 123 in a unit area increases, a distance between the first through vias 123 may be reduced to more prominently cause signal noise such as crosstalk between the first through vias 123. The signal noise between the first through vias 123 may affect a signal transmission characteristic or a signal integrity at a high frequency. According to the present embodiment, because a space between the first post bumps 125 is filled with a dielectric layer, such as an EMC material having a relatively low dielectric constant as compared with a semiconductor material, a crosstalk phenomenon between the first post bumps 125 may be more effectively suppressed. At room temperature and at a frequency of 1 KHz, a silicon material may have a dielectric constant of approximately 11.68 and an EMC material may have a dielectric constant of approximately 3.7. The dielectric constant difference between the first inner molding layer 160 and the body 129 of the first bridge die 120 may influence an electrical characteristic of the first sub-package 100.

The first post bumps 125 may have a second diameter D2 which is greater than the first diameter D1 of the first through vias 123. Because the first diameter D1 corresponding to a diameter of the first through vias 123 is less than the second diameter D2 corresponding to a diameter of first post bumps 125, a distance between the first through vias 123 may be relatively greater than a distance between the first post bumps 125. Accordingly, signal noises between the first through vias 123 may be efficiently suppressed.

As described above, increasing a distance between the first through vias 123 may serve to suppress generation of the signal noise between the first through vias 123. In order to increase a distance between the first through vias 123, the first diameter D1 of the first through vias 123 may be reduced. If a process for forming the first through vias 123 exhibits a certain and fixed aspect ratio, a thickness of the body 129 of the first bridge die 120 may be reduced in order to obtain a fine diameter of the first through vias 123. According to the present embodiment, because the body 129 of the first bridge die 120 has a thickness which is less than a thickness of the first semiconductor die 110, the first through vias 123 may be formed to have the first diameter D1 corresponding to a fine diameter. Thus, a distance between the first through vias 123 may increase to suppress the generation of signal noise between the first through vias 123.

The first post bumps 125 may be metal post bumps including a copper material. The first post bumps 125 may have a vertical length or a height of approximately 60 micrometers, for some embodiments. The second diameter D2 of the first post bumps 125 may be within the range of approximately 20 micrometers to approximately 30 micrometers, for some embodiments. In contrast, the first diameter D1 of the first through vias 123 may be approximately 0.5 micrometers, for some embodiments. Since the first post bumps 125 are formed to have the second diameter D2 corresponding to a relatively large diameter, it may be possible to directly bond the inner connectors (510 of FIG. 1) such as solder balls or bumps to the top surfaces 125T of the first post bumps 125 without misalignment. That is, the inner connectors (510 of FIG. 1) may be directly bonded to the top surfaces 125T of the first post bumps 125 without using any additional conductive pads for increasing a contact area of the first post bumps 125.

Referring again to FIG. 2, the first inner molding layer 160 may be formed on a surface of the first redistribution structure 150 to cover the first bridge die 120. The first inner molding layer 160 may have an extension part 160E that extends laterally beyond side surfaces 200S of the second sub-package 200 stacked on the first sub-package 100, as illustrated in FIG. 1. Since the first inner molding layer 160 of the first sub-package 100 has the extension part 160E, the first sub-package 100 may have a width which is greater than a width of the second sub-package 200 stacked on the first sub-package 100.

Referring to FIGS. 3 and 4, the first redistribution structure 150 of the first sub-package 100 may be configured to include the first redistributed lines 151 and outer redistribution lines 155 for extending the first redistributed lines 151. The first redistributed lines 151 and the outer redistribution lines 155 may be formed of a conductive layer including metal such as aluminum, copper, and gold.

The first redistributed lines 151 may be conductive lines for electrically connecting the first bridge die 120 to the first semiconductor die 110. The first redistribution structure 150 may include a first dielectric layer 152 revealing the first contact pads 111 of the first semiconductor die 110 and via pads 121 of the first bridge die 120. The first redistributed lines 151 may be disposed on a surface of the first dielectric layer 152 opposite to the first bridge die 120. Each of the first redistributed lines 151 may have a first overlap portion 151D that vertically overlaps with and is electrically connected to any one of the first contact pads 111 revealed by the first dielectric layer 152. Each of the first redistributed lines 151 may have a second overlap portion 151B that vertically overlaps with and is electrically connected to any one of the via pads 121 revealed by the first dielectric layer 152. Each of the first redistributed lines 151 may also include a connection portion 151C extending from the first overlap portion 151D to the second overlap portion 151B.

The via pads 121 of the first bridge die 120 may be disposed on a bottom surface of the body 129 of the first bridge die 120 to be located between the first through vias 123 and the second overlap portions 151B of the first redistributed lines 151. More specifically, the via pads 121 may be formed on bottom surfaces of the first through vias 123 for interconnection, and the second overlap portion 151B of the first redistributed lines 151 may be formed to overlap with the via pads 121. The via pads 121 may be connected to the first through vias 123 and may be formed to have a diameter which is greater than a diameter of the first through vias 123. The via pads 121 may be interconnection members that electrically connect the first through vias 123 to the first redistributed lines 151. The via pads 121 may be formed of a metal material such as a copper material or an aluminum material.

The first redistribution structure 150 may further include a second dielectric layer 153 electrically isolating the first redistributed lines 151 from each other and revealing a portion of each of the first redistributed lines 151. The outer redistribution lines 155 may be disposed on a bottom surface of the second dielectric layer 153 such that first ends of the outer redistribution lines 155 respectively overlap with the revealed portions of the first redistributed lines 151.

The outer redistribution lines 155 may be located at a different level from the first redistributed lines 151. The first redistribution structure 150 may further include a third dielectric layer 154 electrically isolating the outer redistributed lines 155 from each other and revealing a portion of each of the outer redistributed lines 155. The first to third dielectric layers 152, 153, and 154 may provide a dielectric structure that electrically isolates the first redistributed lines 151 and the outer redistributed lines 155 from each other. Portions 155P of the outer redistributed lines 155 may be revealed by holes penetrating the third dielectric layer 154, and the outer connectors 590 may be attached or bonded to the revealed portions 155P of the outer redistributed lines 155. The outer redistributed lines 155 may be introduced to extend electrical paths of the first redistributed lines 151 to the outer connectors 590.

Figure 7:
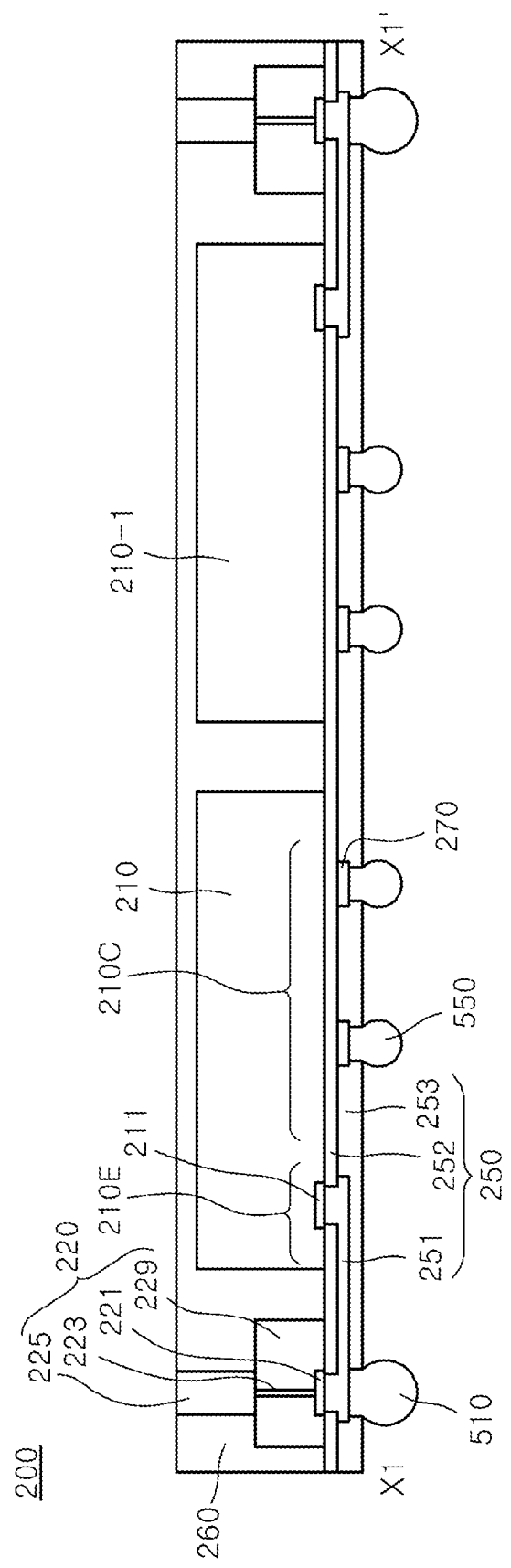
FIGS. 7 to 11 illustrate a second sub-package included in the stack package of FIG. 1.
Figure 8:
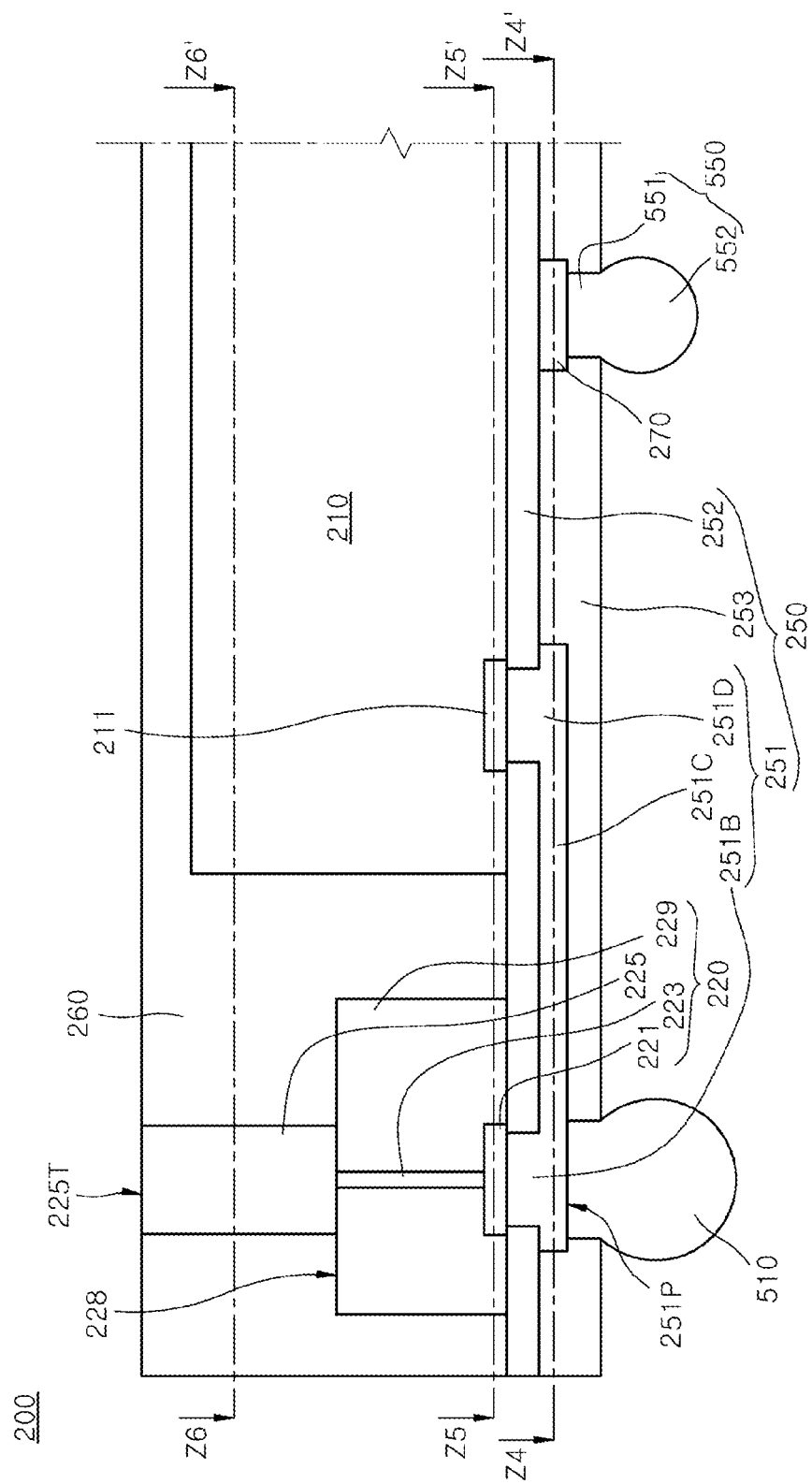
Figure 9:
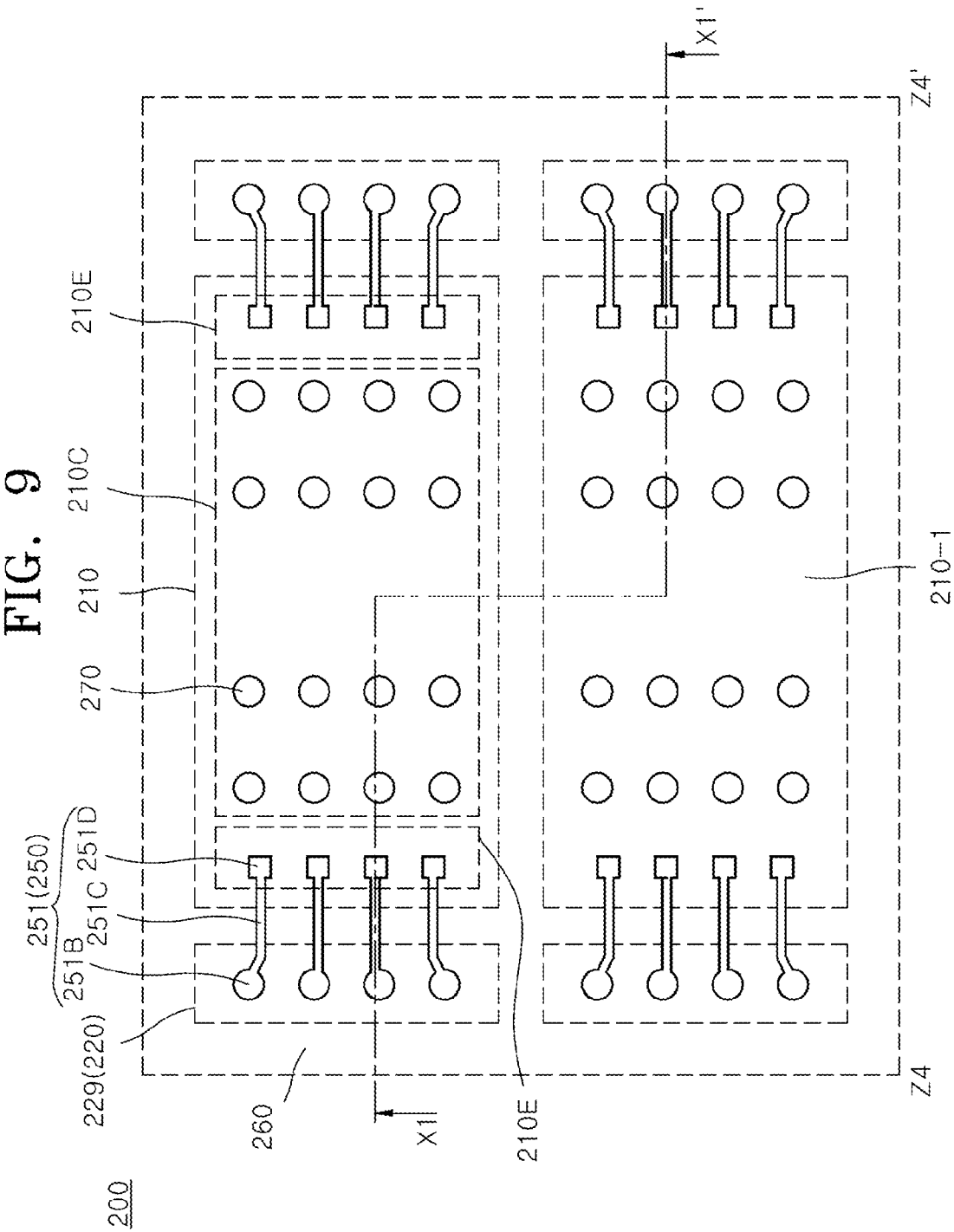
Figure 10:
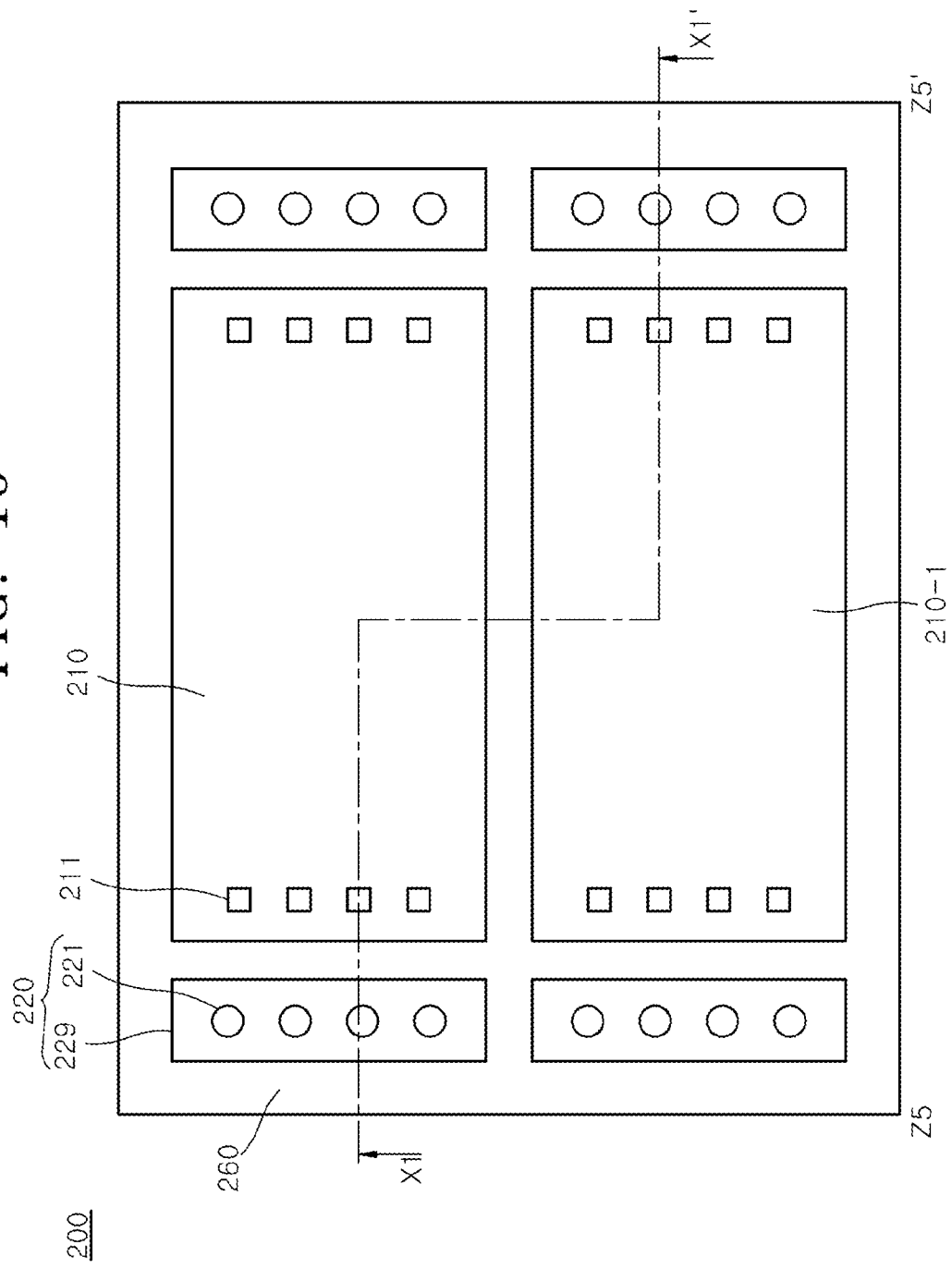
Figure 11:
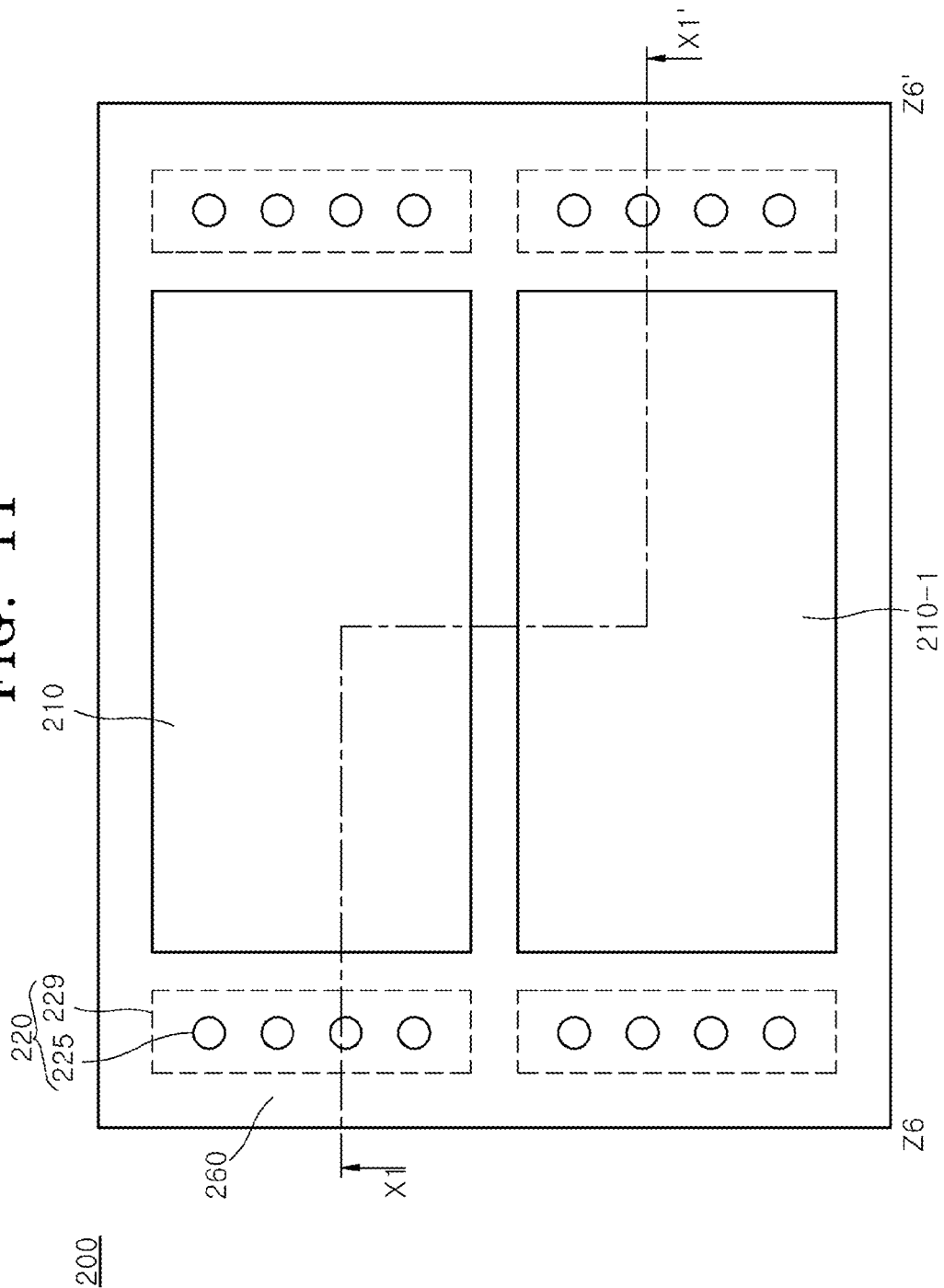

FIG. 7 shows a cross-sectional view illustrating the second sub-package 200 included in the stack package 10 of FIG. 1. FIG. 8 is an enlarged view illustrating a portion (including a second bridge die 220) of the second sub-package 200 shown in FIG. 7. FIG. 9 shows a plan view taken along a horizontal line Z4-Z4' of FIG. 8 to illustrate second redistributed lines 251. FIG. 10 shows a plan view taken along a horizontal line Z5-Z5' of FIG. 8 to illustrate the second bridge die 220 and a second semiconductor die 210. FIG. 11 shows a plan view taken along a horizontal line Z6-Z6' of FIG. 8 to illustrate second post bumps 225 and the second semiconductor die 210. FIG. 7 corresponds to a cross-sectional view taken along a line X1-X1' of FIG. 9.

Referring to FIGS. 1 and 7, the second sub-package 200 may be provided as a single package unit vertically stacked on the first sub-package 100 in the stack package 10.

The second sub-package 200 may include the second semiconductor die 210 and the second bridge die 220, which are disposed on a second redistribution structure 250 to be spaced apart from each other. In such a case, the second semiconductor die 210 may be a semiconductor die having a similar shape and a similar function to the first semiconductor die (110 of FIG. 1). As illustrated in FIG. 1, the second semiconductor die 210 may be a memory semiconductor die having substantially the same shape and function as the first semiconductor die 110. The second bridge die 220 may have substantially the same shape as the first bridge die 120. The second semiconductor die 210 may be located to vertically overlap with the first semiconductor die 110, and the second bridge die 220 may be located to vertically overlap with the first bridge die 120.

Referring to FIGS. 7 and 8, the second sub-package 200 may be configured to include a second inner molding layer 260 that is disposed on the second redistribution structure 250 to cover and protect the second semiconductor die 210 and the second bridge die 220. The second inner molding layer 260 may be substantially the same material as the first inner molding layer (160 of FIG. 1). The second inner molding layer 260 may be formed to fill a gap between the second semiconductor die 210 and the second bridge die 220, which are disposed on the second redistribution structure 250. The second inner molding layer 260 may be formed to have a width which is less than a width of the first inner molding layer 160 such that the extension part 160E of the first inner molding layer 160 laterally protrudes from the side surfaces 200S of the second sub-package 200, as illustrated in FIG. 1.

Referring to FIGS. 7 and 10, second contact pads 211 may be disposed on a surface of the second semiconductor die 210 similar to the first contact pads 111 disposed on the first semiconductor die 110. The second contact pads 211 may correspond to edge pads which are disposed on both edge regions of the second semiconductor die 210, as illustrated in the plan view of FIG. 10. A fourth semiconductor die 210-1 may be disposed side by side with the second semiconductor die 210 on the second redistribution structure 250. The fourth semiconductor die 210-1 may be a semiconductor die having substantially the same shape and configuration as the second semiconductor die 210. The fourth semiconductor die 210-1 may be disposed to have a mirror image with respect to the second semiconductor die 210. The second and fourth semiconductor dies 210 and 210-1 may be memory semiconductor dies.

Referring to FIGS. 8 and 11, the second bridge die 220 may be disposed to be spaced apart from the second semiconductor die 210. The second bridge die 220 may be configured to include a body 229 and second post bumps 225 protruding from a top surface 228 of the body 229. The second post bumps 225 may be electrically connected to upper portions of second through vias 223 vertically penetrating the body 229, respectively. The second post bumps 225 may be disposed to overlap with the second through vias 223 in a plan view. The second inner molding layer 260 may be formed to cover the top surface 228 of the body 229 and to surround side surfaces of the second post bumps 225. The second inner molding layer 260 may be formed to expose top surfaces 225T of the second post bumps 225.

Referring to FIGS. 8 and 9, the second redistribution structure 250 of the second sub-package 200 may be configured to include the second redistributed lines 251. The second redistributed lines 251 may be conductive lines for electrically connecting the second bridge die 220 to the second semiconductor die 210. The second redistribution structure 250 may include a fourth dielectric layer 252 revealing the second contact pads 211 of the second semiconductor die 210 and via pads 221 of the second bridge die 220. The via pads 221 of the second bridge die 220 may be disposed on a bottom surface of the body 229 of the second bridge die 220 to be located between the second through vias 223 and fourth overlap portions 251B of the second redistributed lines 251. More specifically, the via pads 221 may be formed on bottom surfaces of the second through vias 223 for interconnection, and the fourth overlap portion 251B of the second redistributed lines 251 may be formed to overlap with the via pads 221.

The second redistributed lines 251 may be disposed on a surface of the fourth dielectric layer 252 opposite to the second bridge die 220. Third overlap portions 251D of the second redistributed lines 251 may be disposed to overlap with the second contact pads 211 revealed by the fourth dielectric layer 252 and may be electrically connected to the second contact pads 211. The fourth overlap portion 251B of the second redistributed lines 251 may be disposed to overlap with the via pads 221 revealed by the fourth dielectric layer 252 and may be electrically connected to the via pads 221. Each of the second redistributed lines 251 may also include a connection portion 251C extending from the third overlap portion 251D to the fourth overlap portion 251B.

The second redistribution structure 250 may further include a fifth dielectric layer 253 electrically isolating the second redistributed lines 251 from each other and revealing a portion 251P of each of the second redistributed lines 251. The inner connectors 510 may be attached to or bonded to the revealed portions 251P of the second redistributed lines 251. The second post bumps 225 may respectively overlap with the second through vias 223 in a plan view, and the second through vias 223 may respectively overlap with the via pads 221 in a plan view. The via pads 221 may respectively overlap with the fourth overlap portion 251B of the second redistributed lines 251 in a plan view, and the fourth overlap portion 251B may respectively overlap with the inner connectors 510 in a plan view. The second post bumps 225, the second through vias 223, the via pads 221, the fourth overlap portion 251B of the second redistributed lines 251, and the inner connectors 510 may provide a plurality of vertical electric paths. Thus, as illustrated in FIG. 1, when the second and third sub-packages 200 and 300 are sequentially stacked on the first sub-package 100, the third sub-package 300 may be electrically connected to the first sub-package 100 through the vertical paths including the second post bumps 225, the second through vias 223, the via pads 221, the fourth overlap portion 251B of the second redistributed lines 251, and the inner connectors 510.

A plurality of dummy pads 270 may be disposed on a surface of the fourth dielectric layer 252 opposite to the second semiconductor die 210 to be spaced apart from the second redistributed lines 251. The dummy pads 270 may be conductive pads which are electrically isolated from the second redistributed lines 251 and the second semiconductor die 210. The dummy pads 270 may be electrically insulated from the second semiconductor die 210 by the fourth dielectric layer 252. The dummy pads 270 may be bases to which dummy balls 550 are attached or bonded. While a metal layer is easily wetted with a solder material, a dielectric layer might not be readily wetted with a solder material. Accordingly, if the dummy balls 550 are realized using solder balls, it may be difficult to stably attach the solder balls to the fifth dielectric layer 253 of the second sub-package 200 or the first inner molding layer (160 of FIG. 1) of the first sub-package (100 of FIG. 1). Thus, the dummy pads 270 may be disposed on the fourth dielectric layer 252 to stably bond the dummy balls 550 to the dummy pads 270.

The dummy pads 270 may be formed while the second redistributed lines 251 are formed using a copper plating process. Thus, the dummy pads 270 and the second redistributed lines 251 may be located at the same level. The fifth dielectric layer 253 may be formed to expose the dummy pads 270 to directly attach or bond the dummy balls 550 to the dummy pads 270 in a subsequent process.

As illustrated in FIGS. 1 and 8, when the second sub-package 200 is stacked on the first sub-package 100, the dummy pads 270 may be wetted with first portions 551 of the dummy balls 550 to be bonded to the dummy pads 270 and the top surfaces 160T of the first inner molding layer 160 may be in contact with second portions 552 of the dummy balls 550 opposite to the dummy pads 270. In such a case, the dummy balls 550 bonded to the dummy pads 270 may have a diameter which is less than a diameter of the inner connectors 510.

As illustrated in FIG. 1, the inner connectors 510 may be bonded to the first post bumps 125 by wetting the first post bumps 125 with the inner connectors 510. Thus, after the inner connectors 510 are bonded to the first post bumps 125, a height of the inner connectors 510 may be reduced as compared with an initial height of the inner connectors 510. Since the first inner molding layer 160 is not substantially wetted with the dummy balls 550, the dummy balls 550 may maintain their initial height even after the inner connectors 510 are bonded to the first post bumps 125. In order that top portions of the inner connectors 510 and the dummy balls 550 are located at substantially the same level after the inner connectors 510 are bonded to the first post bumps 125, an initial diameter of the dummy balls 550 may be less than an initial diameter of the inner connectors 510. The diameters of the dummy balls 550 and the inner connectors 510 may be construed as parameters meaning heights thereof. In some embodiments, the inner connectors 510 may be provided to have an initial diameter of approximately 30 micrometers, and the dummy balls 550 may be provided to have an initial diameter of approximately 20 micrometers.

Referring to FIG. 9, the dummy pads 270 may be disposed to overlap with the second semiconductor die 210 in a plan view. The second contact pads 211 of the second semiconductor die 210 may be disposed on both edge regions 210E of the second semiconductor die 210, as illustrated in FIGS. 7 and 8. Because the second contact pads 211 correspond to edge pads, the dummy pads 270 may be arrayed on a central region 210C of the second semiconductor die 210. Referring to FIG. 9, the dummy pads 270 and the dummy balls 550 may be disposed to overlap with the second semiconductor die 210 and the fourth semiconductor die 210-1. As illustrated in FIGS. 7 and 8, the dummy balls 550 may be disposed on the central region 210C of the second semiconductor die 210 so as not to overlap with second contact pads 211.

Figure 12:
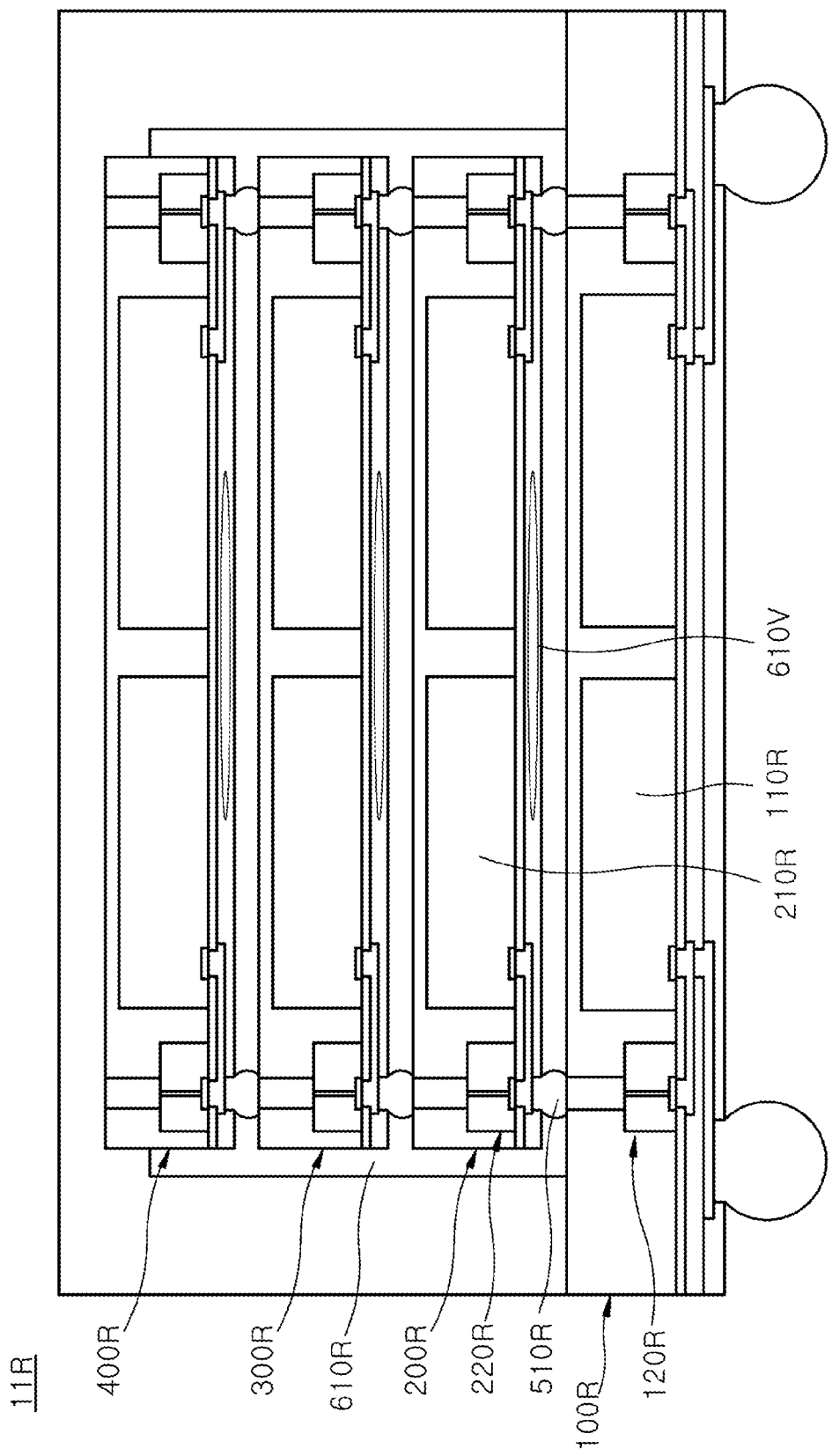
FIGS. 12 to 14 illustrate a suppression effect of a void phenomenon in a stack package, according to an embodiment.
Figure 13:
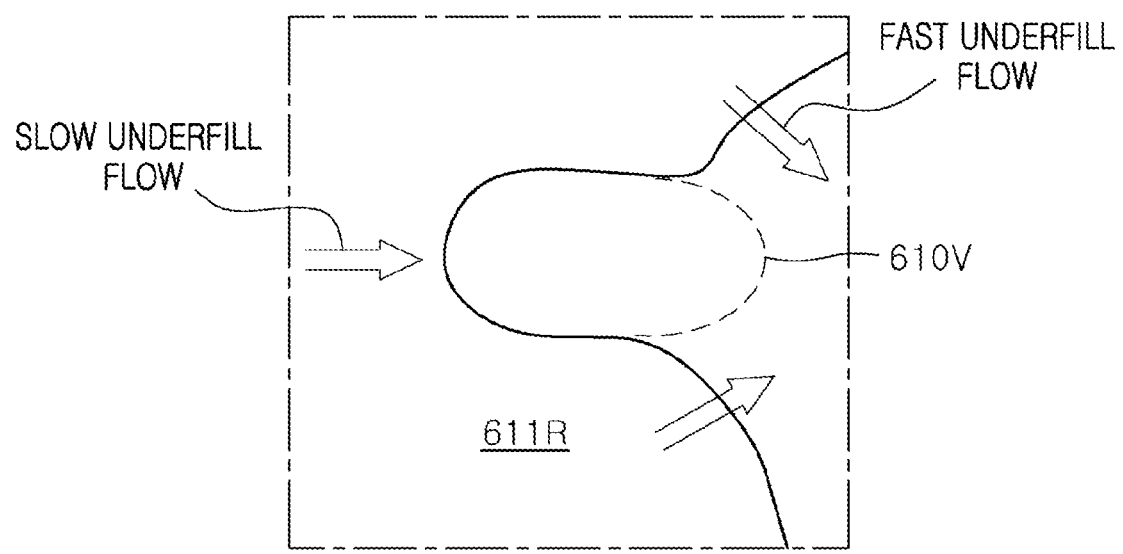
Figure 14:
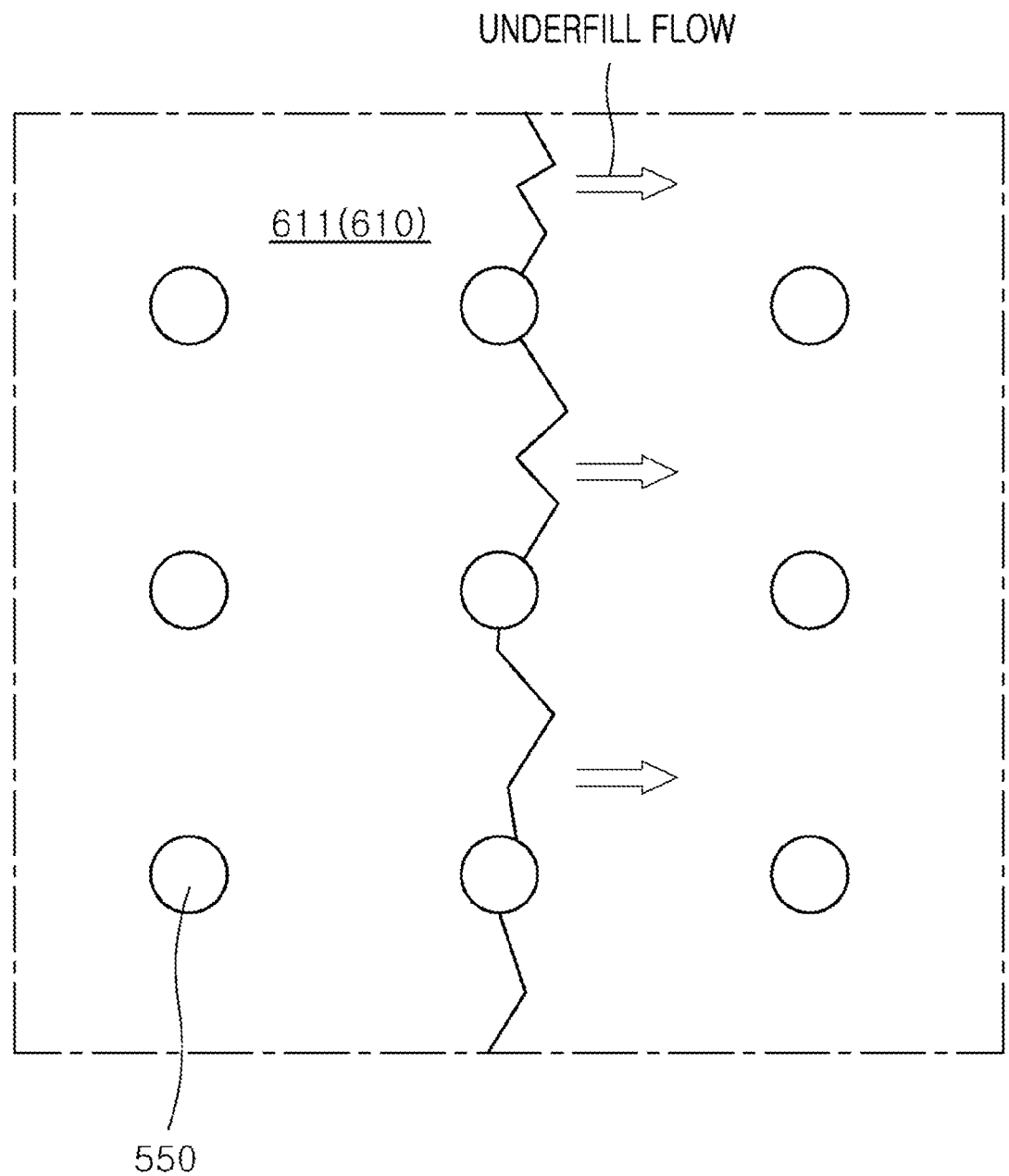

FIG. 12 shows a cross-sectional view illustrating voids 610V generated in a stack package 11R according to a comparative example. FIG. 13 shows a schematic view illustrating a phenomenon of void 610V formation. FIG. 14 shows a plan view illustrating suppression of a void in a stack package according to an embodiment.

Referring to FIG. 12, the stack package 11R, according to a comparative example, may be configured to include first to fourth sub-packages 100R, 200R, 300R, and 400R, which are sequentially stacked. If the first to fourth sub-packages 100R, 200R, 300R, and 400R are sequentially stacked without using the dummy balls (550 of FIG. 1), the voids 610V may be formed during an underfill process for filling gaps between the first to fourth sub-packages 100R, 200R, 300R, and 400R with a filling layer 610R.

The voids 610V may be formed in a vertical overlap region of first semiconductor dies 110R included in the first sub-package 100R and second semiconductor dies 210R included in the second sub-package 200R. The first sub-package 100R and the second sub-package 200R may be electrically coupled to each other by inner connectors 510R that electrically connect a first bridge die 120R included in the first sub-package 100R to a second bridge die 220R included in the second sub-package 200R. The voids 610V, which are not filled with the filling layer 610R, may be formed between the inner connectors 510R disposed between the first semiconductor dies 110R and the second semiconductor dies 210R.

In a vertical overlap region of the first semiconductor dies 110R and the second semiconductor dies 210R, a wide empty space may exist between the first sub-package 100R and the second sub-package 200R before the filling layer 610R is formed. As illustrated in FIG. 13, when an underfill material 611R is introduced into the wide empty space between the first sub-package 100R and the second sub-package 200R to form the filling layer 610R, a flow rate of the underfill material 611R may be different according to the regions. For example, if the flow rate of the underfill material 611R is non-uniform, some spaces may be surrounded by the underfill material 611R after the filling layer 610R is formed. As a result, the voids 610V may be formed.

According to various embodiments, the dummy balls (550 of FIG. 1) may prevent the voids 610V from being formed. Referring to FIGS. 1 and 14, the dummy balls 550 may be uniformly arrayed in a space between the first sub-package 100 and the second sub-package 200. When an underfill material 611 is introduced into a space between the first and second sub-packages 100 and 200 to form the filling layer 610, a flow rate of the underfill material 611 may become uniform due to the presence of the dummy balls 550. That is, the dummy balls 550 may induce a capillary effect, and the underfill material 611 may flow uniformly due to the capillary effect. Accordingly, the dummy balls 550 may prevent the voids (610V of FIG. 12) from being formed in spaces between the sub-packages (100, 200, 300, and 400 of FIG. 1) while the filling layer 610 is formed.

Figure 15:
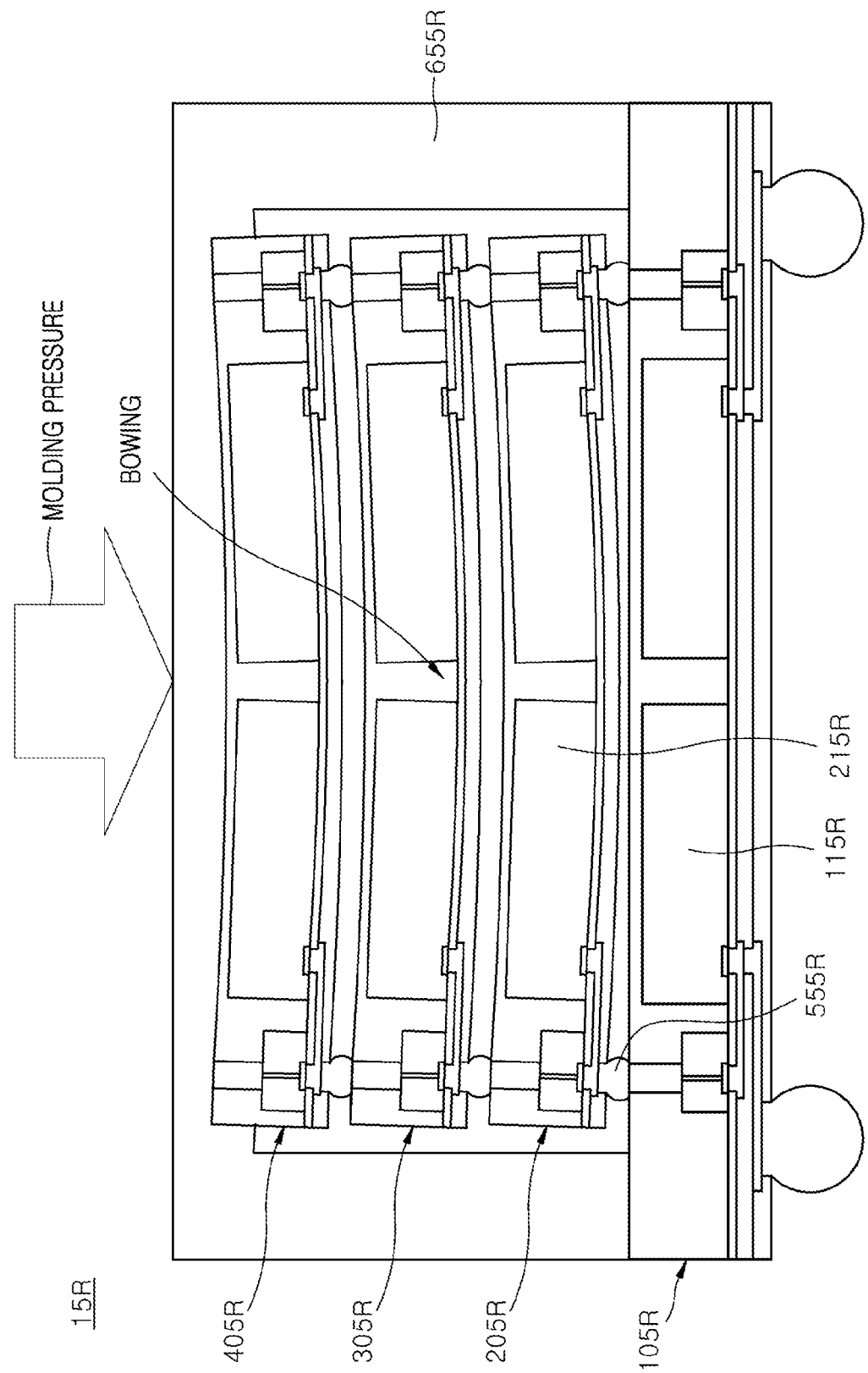
FIG. 15 shows a cross-sectional view illustrating a bowing phenomenon of a general stack package, according to a comparative example.

FIG. 15 shows a cross-sectional view illustrating a bowing phenomenon of sub-packages included in a stack package 15R, according to a comparative example.

Referring to FIG. 15, the stack package 15R may be configured to include first to fourth sub-packages 105R, 205R, 305R, and 405R, which are sequentially stacked. If the first to fourth sub-packages 105R, 205R, 305R, and 405R are sequentially stacked without using the dummy balls (550 of FIG. 1), the second to fourth sub-packages 205R, 305R, and 405R may bow to cause cracks of stack package 15R. While an outer molding layer 655R covering the second to fourth sub-packages 205R, 305R, and 405R is formed, a molding process accompanied by pressure may be performed. In such a case, the second to fourth sub-packages 205R, 305R, and 405R may bow due to the pressure applied to the stack package 15R.

The first to fourth sub-packages 105R, 205R, 305R, and 405R may be supported by inner connectors 555R. The inner connectors 555R may be located to vertically overlap with both edge regions of each of the second to fourth sub-packages 205R, 305R, and 405R. That is, no inner connectors exist in vertical overlap regions of the first and second semiconductor dies 115R and 215R included in the first and second sub-packages 105R and 205R. Similarly, no inner connectors exist in vertical overlap regions of semiconductor dies included in the third and fourth sub-packages 305R and 405R. Accordingly, the pressure applied to the stack package 15R during the molding process may be concentrated on central portions of the second to fourth sub-packages 205R, 305R, and 405R to cause deformation (e.g., warpage) of the second to fourth sub-packages 205R, 305R, and 405R. If the second to fourth sub-packages 205R, 305R, and 405R severely warp, cracks may be formed in the central portions of the second to fourth sub-packages 205R, 305R, and 405R.

According to embodiments, the dummy balls (550 of FIG. 1) may suppress or mitigate the warpage and cracks of the sub-packages 200, 300, and 400. As illustrated in FIG. 1, the dummy balls 550 may be uniformly arrayed in spaces between the sub-packages 100, 200, 300, and 400. The dummy balls 550 may be disposed to support the central portions of the second to fourth sub-packages 200, 300, and 400. Thus, the dummy balls 550 may suppress the warpage of the second to fourth sub-packages 200, 300, and 400 during the molding process.

Figure 16:
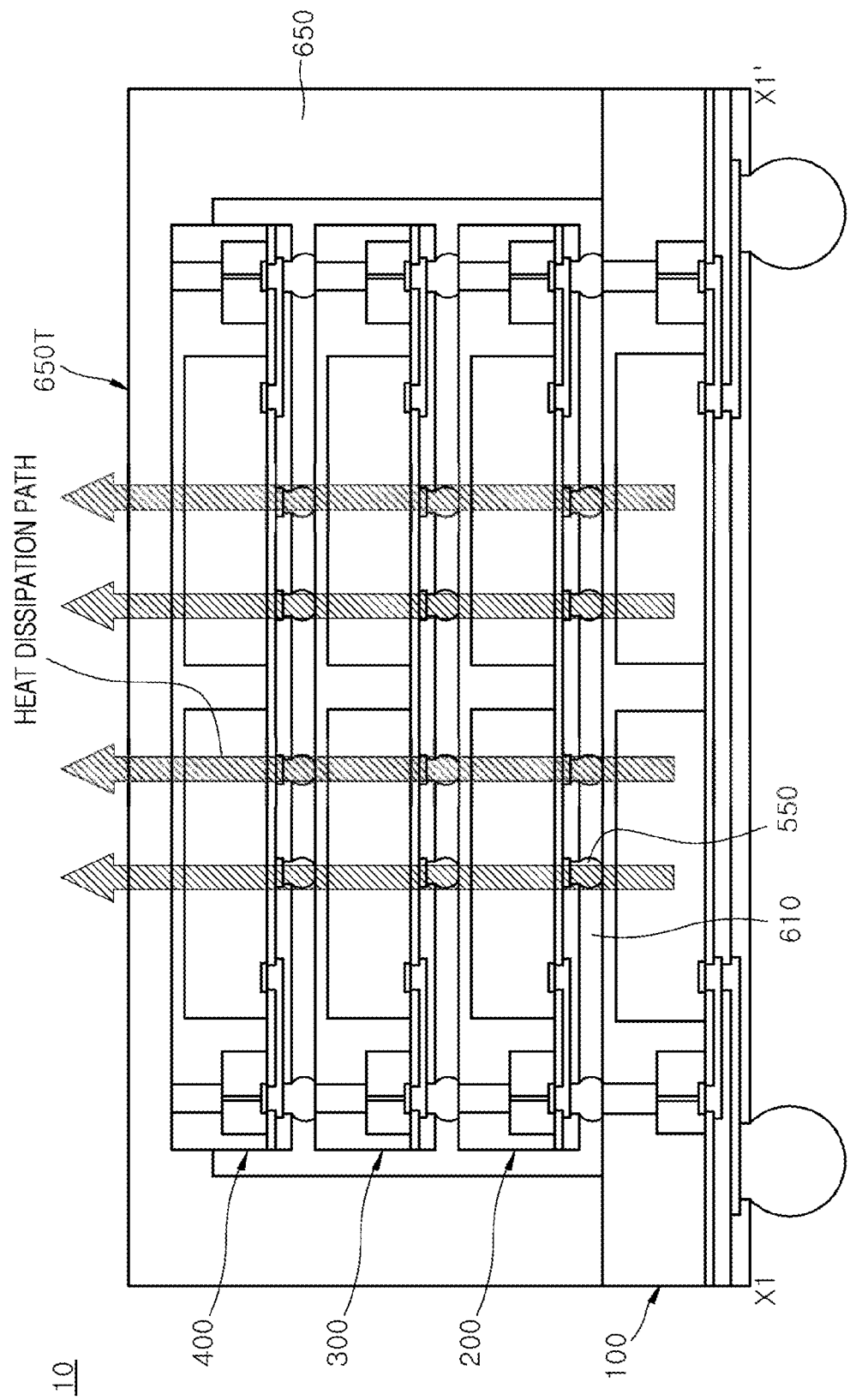
FIG. 16 shows a cross-sectional view illustrating a heat radiation effect of a stack package, according to according to an embodiment.

FIG. 16 shows a cross-sectional view illustrating an improved heat dissipation effect (also referred to as a heat radiation effect) of the stack package 10 shown in FIG. 1.

Referring to FIG. 16, the dummy balls 550 may be introduced into spaces between the sub-packages 100, 200, 300, and 400 of the stack package 10. The dummy balls 550 may be formed of a material having a thermal conductivity which is higher than a thermal conductivity of the filling layer 610. For example, the dummy balls 550 may be formed of a metal material or a solder material. Because a thermal conductivity of the dummy balls 550 is higher than a thermal conductivity of the filling layer 610, the dummy balls 550 may act as heat radiation paths (also referred to as heat dissipation paths) between the sub-packages 100, 200, 300, and 400. Accordingly, heat generated in the sub-packages 100, 200, 300, and 400 may be more effectively radiated toward the top surface 650T of the outer molding layer 650 through the dummy balls 550. Thus, the dummy balls 550 may improve a heat dissipation characteristic of the stack package 10. Although not shown in the drawings, a heat spreader or a heat sink may be additionally attached to the top surface 650T of the outer molding layer 650 to further improve heat dissipation.

Figure 17:
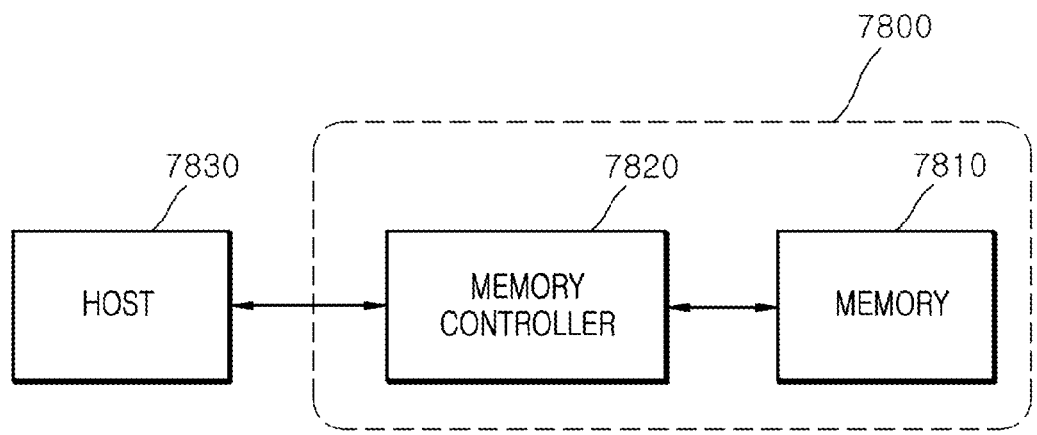
FIG. 17 shows a block diagram illustrating an electronic system employing a memory card including a stack package, according to an embodiment.

FIG. 17 shows a block diagram illustrating an electronic system including a memory card 7800 employing a stack package according to an embodiment. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include the stack package according to an embodiment.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 18:
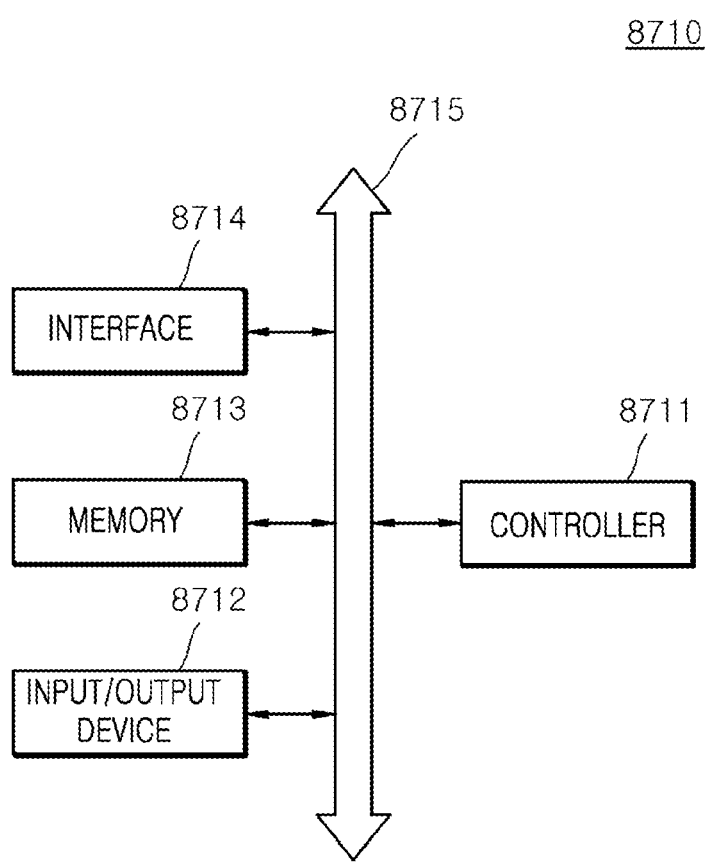
FIG. 18 shows a block diagram illustrating another electronic system including a stack package, according to an embodiment.

FIG. 18 shows a block diagram illustrating an electronic system 8710 including the stack package, according to the embodiment. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessors, digital signal processors, microcontrollers, and/or logic devices capable of performing the same functions as such components. The controller 8711 and/or the memory 8713 may include one or more stack packages according to embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device, such as a DRAM, and/or a nonvolatile memory device, such as a flash memory. For example, a flash memory may be mounted to an information processing system, such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), or Wibro (wireless broadband Internet).

A limited number of possible embodiments for the present disclosure have been disclosed for illustrative purposes. Those skilled in the art will appreciate that various modifications, additions, and substitutions are possible regarding presented embodiments, without departing from the scope and spirit of the present disclosure and the accompanying claims.

What is claimed is:

1. A stack package comprising:
a first sub-package comprising a first semiconductor die, a first bridge die spaced apart from the first semiconductor die, a first inner molding layer covering the first semiconductor die and the first bridge die, and a first redistribution structure electrically connecting the first semiconductor die to the first bridge die;
a second sub-package stacked on the first sub-package;
an inner connector electrically connecting the first bridge die to the second sub-package; and
a plurality of dummy balls disposed between the first and second sub-packages to support the second sub-package,
wherein the first bridge die comprises a first body, a first through via penetrating the first body, and a first post bump connected to a first end of the first through via and protruding from a top surface of the first body,
wherein the first inner molding layer surrounds a side surface of the first post bump and reveals a top surface of the first post bump, and
wherein the first redistribution structure electrically connects the first semiconductor die to a second end of the first through via.

2. The stack package of claim 1, wherein the second sub-package comprises:
a second semiconductor die;
a second bridge die configured to comprise a second body spaced apart from the second semiconductor die, a second through via penetrating the second body, and a second post bump connected to a first end of the second through via and protruding from a top surface of the second body;
a second inner molding layer configured to cover the second semiconductor die and the second bridge die, configured to surround a side surface of the second post bump, and configured to reveal a top surface of the second post bump; and
a second redistribution structure configured to electrically connect the second semiconductor die to a second end of the second through via.

3. The stack package of claim 2,
wherein the second sub-package further comprises a plurality of dummy pads which are spaced apart from the second redistribution structure and which are electrically isolated from the second semiconductor die; and
wherein each dummy ball of the plurality of dummy balls has a first end which is bonded to a corresponding dummy pad of the plurality of dummy pads and has a second end which is in contact with the first inner molding layer.

4. The stack package of claim 2, wherein the plurality of dummy balls are overlapped by the second semiconductor die.

5. The stack package of claim 4,
wherein the second semiconductor die comprises contact pads disposed on an edge region of the second semiconductor die;
wherein the contact pads are electrically connected to the second redistribution structure; and
wherein the plurality of dummy balls are disposed on a central region of the second semiconductor die.

6. The stack package of claim 2, wherein the second bridge die further comprises a via pad that is disposed between the second through via and the second redistribution structure, that is connected to the second through via, and that has a diameter which is greater than a diameter of the second through via.

7. The stack package of claim 6, wherein the second post bump, the second through via, the via pad, a portion of the second redistribution structure, and the inner connector are disposed to vertically overlap with each other.

8. The stack package of claim 1, wherein each of the plurality of dummy balls has a diameter which is less than a diameter of the inner connector.

9. The stack package of claim 1, wherein the first body has a thickness which is less than a thickness of the first semiconductor die.

10. The stack package of claim 1, wherein a distance between a top surface of the first inner molding layer and a top surface of the first body is greater than a distance between the top surface of the first inner molding layer and a top surface of the first semiconductor die.

11. The stack package of claim 1, wherein a portion of a side surface of the first post bump faces a side surface of the first semiconductor die.

12. The stack package of claim 1, wherein the first post bump has a diameter which is greater than a diameter of the first through via.

13. The stack package of claim 1,
wherein the first inner molding layer comprises an insulation material; and
wherein the first body comprises a semiconductor material.

14. The stack package of claim 1, further comprising a filling layer that fills an empty space between the first and second sub-packages.

15. The stack package of claim 14, wherein the plurality of dummy balls have a thermal conductivity which is higher than a thermal conductivity of the filling layer.

16. The stack package of claim 14, wherein the filling layer comprises an underfill material.

17. The stack package of claim 14, further comprising an outer molding layer that is disposed on the filling layer to cover the first and second sub-packages.

18. The stack package of claim 1, further comprising:
a third sub-package stacked on a surface of the second sub-package opposite to the first sub-package;
a first plurality of additional dummy balls disposed between the second and the third sub-packages to support the third sub-package;
a fourth sub-package stacked on a surface of the third sub-package opposite to the second sub-package; and
a second plurality of additional dummy balls disposed between the third and the fourth sub-packages to support the fourth sub-package.

19. A stack package comprising:
a first sub-package;
a second sub-package stacked on the first sub-package;
an inner connector disposed between the first and second sub-packages to electrically connect the second sub-package to the first sub-package;
a plurality of dummy balls disposed between the first and second sub-packages to support the second sub-package; and
an outer connector electrically connected to the first sub-package,
wherein the first sub-package comprises:
a first semiconductor die;
a first bridge die configured to include a first body spaced apart from the first semiconductor die, a first through via penetrating the first body, and a first post bump connected to a first end of the first through via and protruding from a top surface of the first body;
a first inner molding layer configured to cover the first semiconductor die and the first bridge die, wherein the first inner molding layer has an extension part that extends laterally beyond side surfaces of the second sub-package;
a first redistributed line electrically connecting a second end of the first though via to the first semiconductor die; and
an outer redistributed line electrically connecting the first redistributed line to the outer connector.

20. The stack package of claim 19, further comprising an outer molding layer that covers the extension part of the first inner molding layer and covers the second sub-package.

* * * * *